US011689159B2

(12) United States Patent
Itasaka

(10) Patent No.: US 11,689,159 B2
(45) Date of Patent: Jun. 27, 2023

(54) CIRCUIT DEVICE AND OSCILLATOR

(71) Applicant: SEIKO EPSON CORPORATION, Tokyo (JP)

(72) Inventor: Yosuke Itasaka, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/732,608

(22) Filed: Apr. 29, 2022

(65) Prior Publication Data
US 2022/0352851 A1 Nov. 3, 2022

(30) Foreign Application Priority Data

Apr. 30, 2021 (JP) ............................. JP2021-077559

(51) Int. Cl.
H03B 5/36 (2006.01)
(52) U.S. Cl.
CPC ............ *H03B 5/366* (2013.01); *H03B 5/362* (2013.01); *H03B 2200/0034* (2013.01)
(58) Field of Classification Search
CPC . H03B 5/30; H03B 5/32; H03B 5/326; H03B 5/36; H03B 5/362; H03B 5/364; H03B 5/366; H03B 5/368
See application file for complete search history.

(56) References Cited

U.S. PATENT DOCUMENTS

| 9,252,789 B2* | 2/2016 | Itasaka | H03L 1/028 |
| 9,614,509 B1* | 4/2017 | Ahmed | H03B 5/32 |
| 2011/0074499 A1* | 3/2011 | Sako | H03B 5/36 |
| | | | 327/596 |
| 2015/0116048 A1 | 4/2015 | Yamamoto et al. | |
| 2015/0145611 A1* | 5/2015 | Ito | H03B 5/366 |
| | | | 331/116 R |

FOREIGN PATENT DOCUMENTS

JP 2015-088930 5/2015

* cited by examiner

*Primary Examiner* — Levi Gannon
(74) *Attorney, Agent, or Firm* — Rankin, Hill & Clark LLP

(57) ABSTRACT

A circuit device includes a first terminal to be coupled to one end of a resonator, a second terminal to be coupled to another end of the resonator, an amplifying element configured to amplify a signal from the first terminal to output the signal amplified to the second terminal, a first resistor element disposed on a signal path between an input node and an output node of the amplifying element, a capacitance element disposed on a signal path between the first terminal and the input node, and a first switch element configured to switch electrical coupling between the input node and a ground.

14 Claims, 10 Drawing Sheets

CIRCUIT DEVICE AND OSCILLATOR

The present application is based on, and claims priority from JP Application Serial Number 2021-077559, filed Apr. 30, 2021, the disclosure of which is hereby incorporated by reference herein in its entirety.

BACKGROUND

1. Technical Field

The present disclosure relates to a circuit device and an oscillator.

2. Related Art

In resonators such as quartz crystal resonators (piezoelectric resonators) or MEMS (Micro Electro Mechanical Systems) resonators, characteristics of the resonator are examined by performing an overdrive examination in which an AC (alternating current) signal high in current, voltage, or power is applied to drive the resonator to thereby examine the frequency characteristic and so on of the resonator, a drive level examination in which a signal obtained by gradually increasing or decreasing the AC signal high in current, voltage, or power is applied to drive the resonator to thereby examine a fluctuation of the frequency characteristic and so on of the resonator.

In JP-A-2015-088930 (Document 1), there is disclosed an oscillator which has a switching circuit inside, and makes it possible to perform an examination of a resonator using external terminals.

However, in the oscillator described in Document 1, when performing the examination of the resonator, when an examination signal is input to an amplifier via a feedback resistor and a condition for the amplifier to operate is fulfilled, there is a possibility that the examination of the resonator is affected.

SUMMARY

A circuit device according to an aspect of the present disclosure includes a first terminal to be coupled to one end of a resonator, a second terminal to be coupled to another end of the resonator, an amplifying element configured to amplify a signal from the first terminal to output the signal amplified to the second terminal, a first resistor element disposed on a signal path between an input node and an output node of the amplifying element, a capacitance element disposed on a signal path between the first terminal and the input node, and a first switch element configured to switch electrical coupling between the input node and a ground.

An oscillator according to another aspect of the present disclosure includes the circuit device according to the aspect, and the resonator.

DESCRIPTION OF EXEMPLARY EMBODIMENTS

Hereinafter, some preferred embodiments of the present disclosure will be described using the drawings. The drawings used herein are for the sake of convenience of explanation. It should be noted that the embodiments described hereinafter do not unreasonably limit the contents of the present disclosure as set forth in the appended claims. Further, all of the constituents described below are not necessarily essential elements of the present disclosure.

1. First Embodiment

1-1. Configuration of Oscillator

Figure 1:
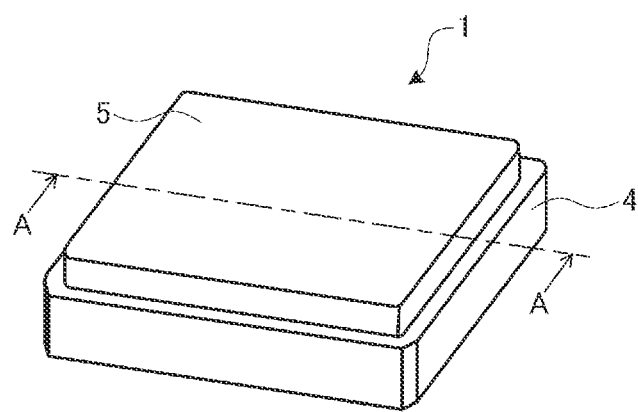
FIG. 1 is a perspective view of an oscillator.
Figure 2:
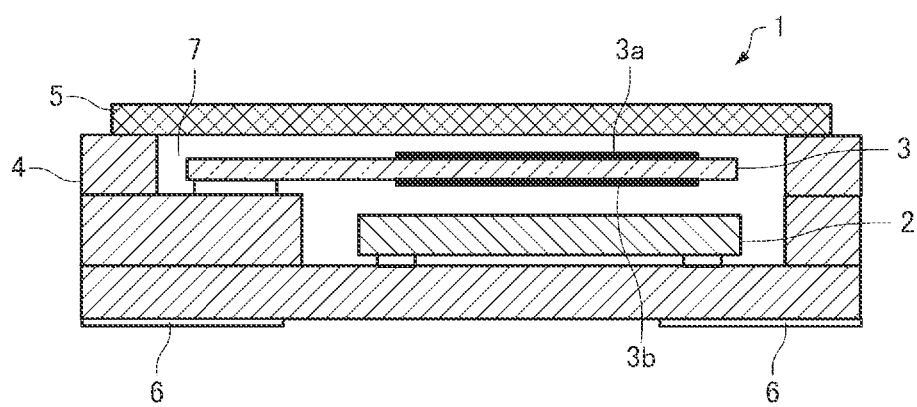
FIG. 2 is a cross-sectional view along the line A-A of the oscillator shown in FIG. 1.

FIG. 1 and FIG. 2 are diagrams showing an example of a structure of an oscillator 1 according to the present embodiment. FIG. 1 is a perspective view of the oscillator 1, and FIG. 2 is a cross-sectional view along the line A-A shown in FIG. 1.

As shown in FIG. 1 and FIG. 2, the oscillator 1 includes a circuit device 2, a resonator 3, a package 4, a lid 5, and a plurality of external terminals 6. In the present embodiment, the resonator 3 is a quartz crystal resonator using quartz crystal as a substrate material, and is, for example, an AT-cut crystal resonator or a tuning-fork crystal resonator. The resonator 3 can be an SAW (Surface Acoustic Wave) resonator or an MEMS (Micro Electro Mechanical Systems) resonator. Further, as the substrate material of the resonator 3, there can be used a piezoelectric single crystal of lithium tantalate, lithium niobate, or the like, a piezoelectric material such as piezoelectric ceramics including lead zirconate titanate, or a silicon semiconductor material besides the quartz crystal. As an excitation device of the resonator 3, there can be used a device using a piezoelectric effect, or electrostatic drive using a coulomb force. Further, in the present embodiment, the circuit device 2 is realized by a single-chip integrated circuit (IC). It should be noted that the circuit device 2 can at least partially be constituted by discrete components.

The package 4 houses the circuit device 2 and the resonator 3 in the same space. Specifically, the package 4 is provided with a recessed part, and the recessed part is covered with the lid 5 to thereby form a housing chamber 7. On surfaces of an inside or a recessed part of the package 4, there are disposed interconnections not shown for electrically coupling two terminals of the circuit device 2, specifically, an XO terminal and an XI terminal shown in FIG. 3 described later, and two excitation electrodes 3a, 3b of the resonator 3 respectively to each other. Further, on the surfaces of the inside or the recessed part of the package 4, there are disposed interconnections not shown for electrically coupling the terminals of the circuit device 2 and the external terminals 6 disposed on a bottom surface of the package 4 respectively to each other. It should be noted that the package 4 is not limited to a configuration of housing the circuit device 2 and the resonator 3 in the same space. For example, it is possible to adopt a so-called H-type package in which the circuit device 2 is mounted on one surface of a substrate of the package, and the resonator 3 is mounted on the other surface thereof.

The resonator 3 has the excitation electrodes 3a, 3b each made of metal and respectively disposed on an obverse side and a reverse side of the resonator 3, and oscillates with a desired frequency corresponding to the shape and the mass of the resonator 3 including the excitation electrodes 3a, 3b.

Figure 3:
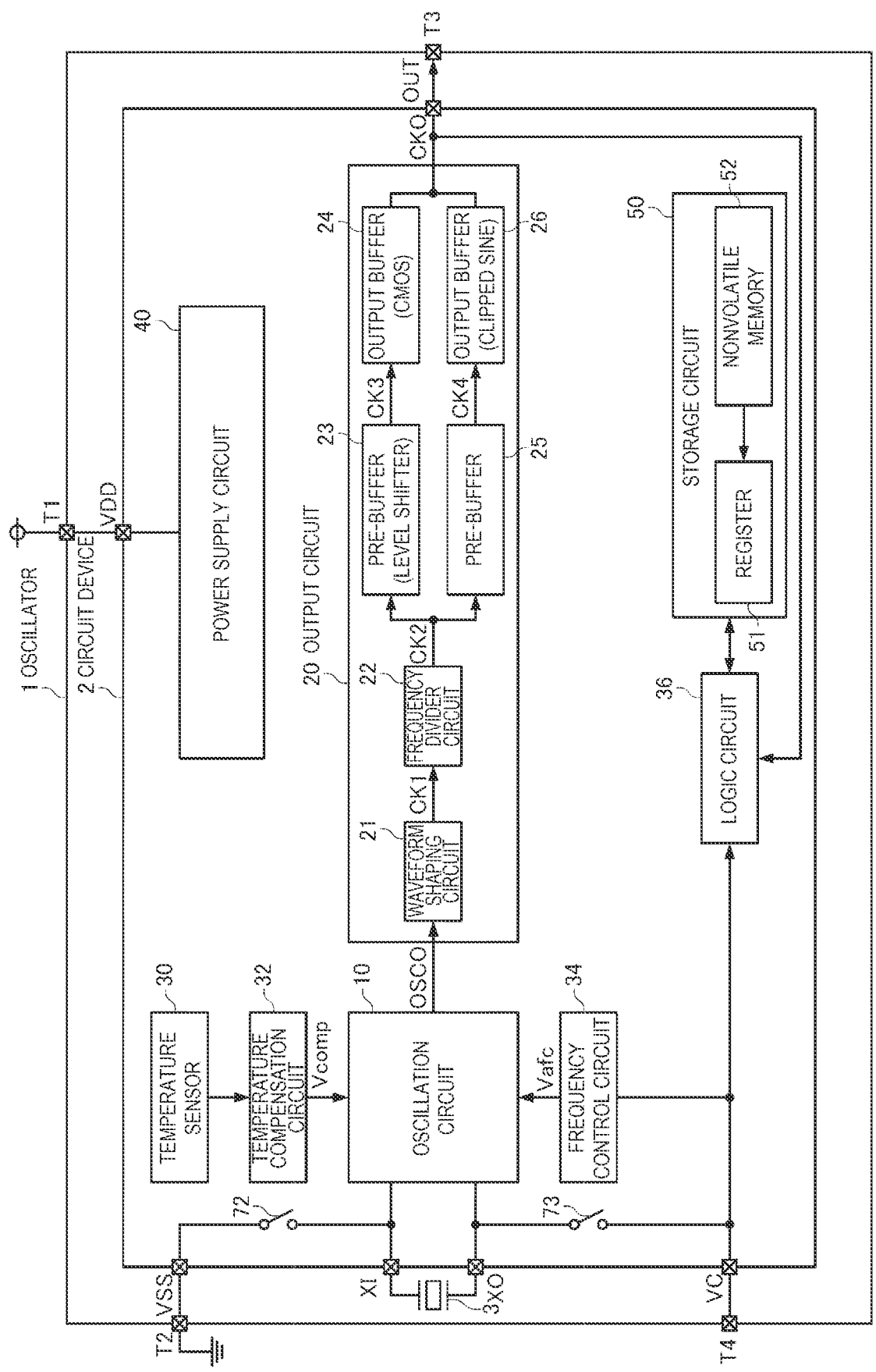
FIG. 3 is a diagram showing a schematic configuration of the oscillator.

FIG. 3 is a functional block diagram of the oscillator 1 according to the first embodiment. As shown in FIG. 3, the oscillator 1 according to the present embodiment includes the circuit device 2 and the resonator 3. The circuit device 2 has a VDD terminal, a VSS terminal, an OUT terminal, a VC terminal, the XI terminal, and the XO terminal as external coupling terminals. The VDD terminal, the VSS terminal, the OUT terminal, and the VC terminal are electrically coupled respectively to a T1 terminal, a T2 terminal, a T3 terminal, and a T4 terminal as the plurality of external terminals 6 of the oscillator 1 shown in FIG. 2.

The XI terminal is electrically coupled to one end of the resonator 3, and the XO terminal is electrically coupled to the other end of the resonator element 3. The VSS terminal is electrically coupled to the ground via the T2 terminal. Further, the VSS terminal is electrically coupled to the XI terminal via a second switch element 72. The VC terminal is electrically coupled to the XO terminal via a third switch element 73.

The second switch element 72 is set to an ON state or an OFF state in accordance with switch control data. The switch control data is supplied to the second switch element 72 from a logic circuit 36. The second switch element 72 switches the electrical coupling between the XI terminal and the VSS terminal.

The third switch element 73 is set to the ON state or the OFF state in accordance with switch control data. The switch control data is supplied to the third switch element 73 from the logic circuit 36. The third switch element 73 switches the electrical coupling between the XO terminal and the VC terminal.

When the second switch element 72 is in the ON state, the XI terminal and the VSS terminal become in a conducting state, and when the second switch element 72 is in the OFF state, the XI terminal and the VSS terminal become in a nonconducting state. When the third switch element 73 is in the ON state, the XO terminal and the VC terminal become in the conducting state, and when the third switch element 73 is in the OFF state, the XO terminal and the VC terminal become in a nonconducting state.

The XI terminal to be coupled to the one end of the resonator 3 is an example of a first terminal, and the XO terminal to be coupled to the other end of the resonator 3 is an example of a second terminal. The VSS terminal to electrically be coupled to the ground is an example of a third terminal, and the VC terminal to electrically be coupled to the XO terminal is an example of a fourth terminal.

In the present embodiment, the circuit device 2 includes an oscillation circuit 10, an output circuit 20, a temperature sensor 30, a temperature compensation circuit 32, a frequency control circuit 34, the logic circuit 36, a power supply circuit 40, a storage circuit 50, the second switch element 72, and the third switch element 73. It should be noted that the circuit device 2 can be provided with a configuration obtained by omitting or modifying some of these constituents, or adding other constituents.

The power supply circuit 40 generates a variety of constant voltages based on a power supply voltage supplied from the outside via the T1 terminal and the VDD terminal, and supplies the constant voltages to the individual circuits. For example, it is possible for the power supply circuit 40 to include a plurality of regulators which respectively generates the constant voltages based on an output voltage of a bandgap reference circuit.

The oscillation circuit 10 is a circuit which is electrically coupled to the XI terminal and the XO terminal to oscillate the resonator 3. Specifically, a signal output from the resonator 3 is input to the oscillation circuit 10 via the XI terminal, and the oscillation circuit 10 amplifies that signal and then supplies the result to the resonator 3 via the XO terminal.

The temperature sensor 30 is a device for detecting the temperature of the circuit device 2 to output a temperature signal having a voltage corresponding to the temperature, and is realized by, for example, a circuit using a temperature characteristic of the bandgap reference circuit.

The temperature compensation circuit 32 generates a temperature compensation voltage Vcomp for correcting a frequency-temperature characteristic of the oscillation signal output from the oscillation circuit 10 based on the temperature signal output from the temperature sensor 30 and the temperature compensation data corresponding to a frequency-temperature characteristic of the resonator 3, and then supplies the result to the oscillation circuit 10. The temperature compensation data is supplied to the temperature compensation circuit 32 from the logic circuit 36.

To the frequency control circuit 34, there is supplied the frequency control signal input from the T4 terminal via the VC terminal. Then, the frequency control circuit 34 generates a frequency control voltage Vafc for controlling the oscillation frequency of the oscillation circuit 10 in accordance with a voltage level of the frequency control signal, and then supplies the result to the oscillation circuit 10.

Due to the temperature compensation voltage Vcomp, the oscillation signal OSCO output by the oscillation circuit 10 becomes to have a substantially constant frequency corresponding to the frequency control voltage Vafc at an arbitrary temperature included in a predetermined temperature range. The oscillation signal OSCO is input to the output circuit 20.

In the present embodiment, the output circuit 20 includes a waveform shaping circuit 21, a frequency divider circuit 22, a pre-buffer 23, an output buffer 24, a pre-buffer 25, and an output buffer 26.

The waveform shaping circuit 21 buffers the oscillation signal OSCO output from the oscillation circuit 10 to output a clock signal CK1 as a rectangular wave.

The frequency divider circuit 22 outputs a clock signal CK2 obtained by dividing the frequency of the clock signal CK1 output from the waveform shaping circuit 21 at a frequency division ratio corresponding to frequency division ratio data. The frequency division ratio data is supplied to the frequency divider circuit 22 from the logic circuit 36. It should be noted that when the frequency division ratio is 1, the frequency divider circuit 22 outputs the clock signal CK2 obtained by buffering the clock signal output from the waveform shaping circuit 21. The clock signal CK2 output from the frequency divider circuit 22 is input commonly to the pre-buffer 23 and the pre-buffer 25.

The pre-buffer 23 outputs a clock signal CK3 obtained by buffering the clock signal CK2 output from the frequency divider circuit 22. The pre-buffer 23 also functions as a level shifter for outputting the clock signal CK3 at a voltage level matched to an input voltage level of the output buffer 24.

The output buffer 24 buffers the clock signal CK3 output from the pre-buffer 23 to output a clock signal having a CMOS output waveform.

The pre-buffer 25 outputs a clock signal CK4 obtained by buffering the clock signal CK2 output from the frequency divider circuit 22.

The output buffer 26 converts the clock signal CK4 output from the pre-buffer 25 into a clock signal having a clipped sine waveform, and outputs the result.

In the present embodiment, an output terminal of the output buffer 24, an output terminal of the output buffer 26, and the OUT terminal are electrically coupled to each other. Further, in accordance with clock selection data, at least one of the output terminal of the output buffer 24 and the output terminal of the output buffer 26 becomes in a high-impedance state. The clock selection data is supplied to the output buffer 24 and the output buffer 26 from the logic circuit 36.

When only the output terminal of the output buffer 26 is in the high-impedance state, the clock signal having the CMOS output waveform output from the output buffer 24 is output to the outside of the oscillator 1 as a clock signal CKO via the OUT terminal and the T3 terminal. Further, when only the output terminal of the output buffer 24 is in the high-impedance state, the clock signal having the clipped sine waveform output from the output buffer 26 is output to the outside of the oscillator 1 as the clock signal CKO via the OUT terminal and the T3 terminal.

The logic circuit 36 controls an operation of each of the circuits. Specifically, the logic circuit 36 sets an operation mode of the oscillator 1 or the circuit device 2 to one of modes including an external communication mode, a normal operation mode, and a variety of examination modes based on a control signal input to a terminal of the circuit device 2, and then performs control corresponding to the operation mode thus set. In the present embodiment, when the control signal having a predetermined pattern is input from the VC terminal within a predetermined period from when the supply of the power supply voltage to the VDD terminal starts, the logic circuit 36 sets the operation mode to the external communication mode after the predetermined period elapses. For example, it is possible for the logic circuit 36 to assume a period until it is detected that the resonator starts the oscillation due to the supply of the power supply voltage and then the oscillation stabilizes as the predetermined period, or it is possible for the logic circuit 36 to count the number of pulses of the oscillation signal, and then determine that the predetermined period has elapsed when the count value has reached a predetermined value. Further, for example, it is possible for the logic circuit 36 to measure the predetermined period based on an output signal of an RC time-constant circuit which starts to operate due to the supply of the power supply voltage.

In the external communication mode, the logic circuit 36 outputs the clock selection data for setting the output of both of the output buffers 24, 26 to the high-impedance state, and at the same time, outputs the switch control data for setting both of the second switch element 72 and the third switch element 73 to the OFF state. In the external communication mode, a serial clock signal and a serial data signal are input in sync with each other from the VC terminal and the OUT terminal. In the external communication mode, the logic circuit 36 samples the serial data signal at every edge of the serial clock signal according to the standard of, for example, the I$^2$C (Inter-Integrated Circuit) bus. Then, based on commands and data thus sampled, the logic circuit 36 performs processing such as setting of the operation mode, setting of the clock selection data and the switch control data in each of the operation modes, reading and writing of data from and to a register 51 or a nonvolatile memory 52. It should be noted that the logic circuit 36 functions as an interface circuit of a two-wire bus such as the I$^2$C (Inter-Integrated Circuit) bus in the present embodiment, but can function as an interface circuit of a three-wire bus or a four-wire bus such as the SPI (Serial Peripheral Interface) bus.

For example, when the logic circuit 36 has sampled a normal operation mode setting command in the external communication mode, the logic circuit 36 makes the transition of the operation mode from the external communication mode to the normal operation mode. In the normal operation mode, the logic circuit 36 outputs the clock selection data for setting the output of only either one of the output buffers 24, 26 to the high-impedance state, and at the same time, outputs the switch control data for setting both of the second switch element 72 and the third switch element 73 to the OFF state, and thus, the second switch element 72 and the third switch element 73 are set to the OFF state. Thus, the XI terminal and the VSS terminal are electrically separated from each other, and the XO terminal and the VC terminal are electrically separated from each other. As a result, the clock signal CKO with a frequency corresponding to the voltage of the VC terminal is output to the outside from the OUT terminal via the T3 terminal. It should be noted that the normal operation mode is an example of a first mode.

It should be noted that when the control signal having the predetermined pattern is not input from the VC terminal within the predetermined period from when the supply of the power supply voltage starts, the logic circuit 36 sets the operation mode directly to the normal operation mode after the predetermined period elapses without setting the operation mode to the external communication mode.

When the logic circuit 36 has sampled a resonator examination mode setting command in the external communication mode, the logic circuit 36 makes the transition of the operation mode from the external communication mode to the resonator examination mode. In the resonator examination mode, the logic circuit 36 outputs the switch control data for setting both of the second switch element and the third switch element 73 to the ON state, and thus, the second switch element 72 and the third switch element 73 are set to the ON state. Thus, the XI terminal is electrically coupled to the VSS terminal via the second switch element 72, and the XO terminal is electrically coupled to the VC terminal via the third switch element 73. As a result, it becomes possible for an external device of the oscillator 1 to supply signals for oscillating the resonator 3 from the T2 terminal to be coupled to the VSS terminal and the T4 terminal to be coupled to the VC terminal. Therefore, it is possible for an examination device as the external device to perform the overdrive examination of supplying the examination signal high in amplitude to the resonator 3 to examine the characteristics, and the drive level examination of examining an excitation level dependency of the resonator 3. It should be noted that the resonator examination mode is an example of a second mode.

The storage circuit 50 is a circuit for storing a variety of types of information, and has the register 51 and the nonvolatile memory 52. The nonvolatile memory 52 is, for example, an MONOS (metal oxide nitride oxide silicon) memory or an EEPROM (Electrically Erasable Programmable Read-Only Memory). In a manufacturing process of the oscillator 1, a variety of types of information such as the temperature compensation data, the frequency division ratio data, and the clock selection data are stored in the nonvolatile memory 52. Then, when the power is applied to the oscillator 1, the variety of types of information stored in the nonvolatile memory 52 are transferred to the register 51, and the variety of types of information stored in the register 51 are arbitrarily supplied to the respective circuits via the logic circuit 36.

1-2. Configuration of Oscillation Circuit

Figure 4:
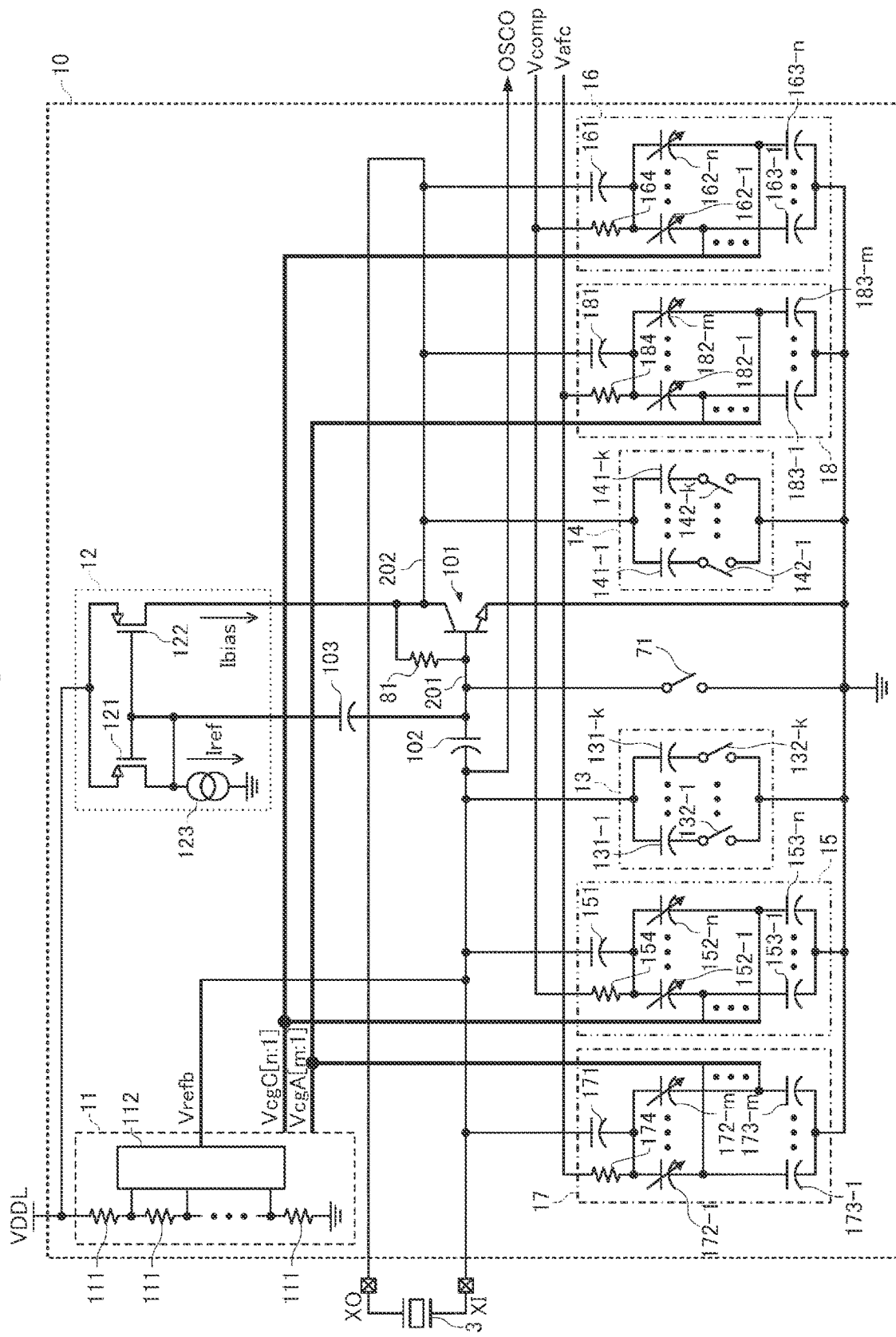
FIG. 4 is a diagram showing a schematic configuration of a circuit device according to a first embodiment.

FIG. 4 is a diagram showing a configuration example of the oscillation circuit 10. As shown in FIG. 4, the oscillation circuit 10 includes a reference voltage circuit 11, a bias current generation circuit 12, a capacitance circuits 13, 14, variable capacitance circuits 15, 16, 17, and 18, a first switch element 71, a first resistor element 81, a bipolar transistor 101, and capacitance elements 102, 103. It should be noted that the oscillation circuit 10 in the present embodiment can be provided a configuration obtained by eliminating or modifying some of these constituents, or adding other constituents.

The reference voltage circuit 11 includes a plurality of resistor elements 111 and a duty ratio adjustment circuit 112. The plurality of resistor elements 111 is coupled in series between a supply line of a power supply voltage VDDL and the ground. The power supply voltage VDDL is supplied from the power supply circuit 40. The reference voltage circuit 11 outputs at least some of the voltages obtained by dividing the voltage between the power supply voltage VDDL and the ground by the plurality of resistor elements 111 as n reference voltages VcgC[n:1] and m reference voltages VcgA[m:1]. The reference symbols m, n each denote an integer equal to or greater than 2. The integer n and the integer m can be the same as each other, or can also be different from each other. Further, at least one of the n reference voltages VcgC[n:1] and at least one of the m reference voltages VcgA[m:1] can be the same as each other. The reference voltages VcgC[n:1] are supplied to the variable capacitance circuits 15, 16. Further, the reference voltages VcgA[m:1] are supplied to the variable capacitance circuits 17, 18.

The duty ratio adjustment circuit 112 selects any one of some or all of the plurality of voltages obtained by the division with the plurality of resistor elements 111 based on the duty ratio adjustment data, and then outputs the result as a bias voltage Vrefb. The duty ratio adjustment data is stored in the nonvolatile memory 52, and the logic circuit 36 supplies the duty ratio adjustment data which has been transferred from the nonvolatile memory 52 to the register 51 to the duty ratio adjustment circuit 112.

The bias current generation circuit 12 includes two P-channel type MOS (Metal Oxide Semiconductor) transistors 121, 122, and a constant current source 123.

In the MOS transistor 121, the gate and the drain are electrically coupled to each other, and the source is supplied with the power supply voltage VDDL. In the MOS transistor 122, the gate is electrically coupled to the gate of the MOS transistor 121, the source is supplied with the power supply voltage VDDL, and the drain is electrically coupled to the collector of the bipolar transistor 101 as an amplifying element. The gate and the drain of the MOS transistor 121 are electrically coupled to one end of the constant current source 123. The other end of the constant current source 123 is coupled to the ground.

In the bias current generation circuit 12 configured in such a manner, a current which is obtained by a current mirror circuit constituted by the MOS transistors 121, 122 multiplying a reference current Iref flowing through the constant current source 123 by a predetermined number flows between the source and the drain of the MOS transistor 122. This current is supplied to the bipolar transistor 101 as a bias current Ibias.

In the capacitance element 102, one end is electrically coupled to the base of the bipolar transistor 101, and the other end is electrically coupled to one end of the resonator 3 via the XI terminal. In other words, the capacitance element 102 is disposed on a signal path between the XI terminal and the base of the bipolar transistor 101. For example, the capacitance element 102 functions as a DC-coupling capacitor.

In the capacitance element 103, one end is electrically coupled to the gate of the MOS transistor 121 and the gate of the MOS transistor 122, and the other end is electrically coupled to the base of the bipolar transistor 101.

In the bipolar transistor 101, the base is electrically coupled to one end of the capacitance element 102, the collector is electrically coupled to the XO terminal, and the emitter is grounded. The bipolar transistor 101 is an example of the amplifying element. The base of the bipolar transistor 101 corresponds to an input node 201, and the collector of the bipolar transistor 101 corresponds to an output node 202.

Further, between the base and the collector of the bipolar transistor 101, there is coupled the first resistor element 81. In other words, the first resistor element 81 is disposed on the signal path between the input node 201 and the output node 202 of the amplifying element. The first resistor element 81 functions as a feedback resistor for the bipolar transistor 101. Further, the collector of the bipolar transistor 101 is supplied with the bias current Ibias.

A signal input from the XI terminal is supplied to the base of the bipolar transistor 101 via the capacitance element 102, and is amplified by the bipolar transistor 101 as the amplifying element. The signal having been amplified is supplied to the resonator 3 from the collector of the bipolar transistor 101 via the XO terminal. In other words, the bipolar transistor 101 amplifies the signal from the XI terminal and then outputs the result to the XO terminal. It should be noted that as the amplifying element, there can be used a MOS transistor or a CMOS inverter instead of the bipolar transistor 101.

The first switch element 71 is set to the ON state or the OFF state in accordance with the switch control data. The switch control data is supplied to the first switch element 71 from the logic circuit 36. The first switch element 71 switches the electrical coupling between the input node 201 of the amplifying element and the ground.

When the first switch element 71 is in the ON state, the base of the bipolar transistor 101 and the ground become in a conducting state, and when the first switch element 71 is in the OFF state, the base of the bipolar transistor 101 and the ground become in a nonconducting state. It should be noted that the first switch element 71 can be an n-type FET, a p-type FET, or a circuit including these components combined with each other.

When the first switch element 71 is in the OFF state, as described above, the bipolar transistor 101 amplifies the signal which is input to the base via the input node 201, and is input from the XI terminal. The signal having been amplified is output from the collector of the bipolar transistor 101 to the XO terminal via the output node 202.

When the first switch element 71 is in the ON state, the base of the bipolar transistor 101 is electrically coupled to the ground. The emitter of the bipolar transistor 101 is electrically coupled to the ground. Since the ON resistance of the first switch element 71 is extremely low, the potential difference Vbe between the base and the emitter of the bipolar transistor 101 approximates to 0 V. Therefore, the bipolar transistor 101 is set to the OFF state. Ideally, the ON resistance of the first switch element 71 is zero, and the potential difference Vbe becomes 0 V.

The oscillation circuit 10 outputs a signal generated at a node between the XI terminal and the other end of the capacitance element 102 as the oscillation signal OSCO. That node is supplied with the bias voltage Vrefb from the duty ratio adjustment circuit 112 of the reference voltage circuit 11. Therefore, the oscillation signal OSCO has a waveform vibrating centering on the bias voltage Vrefb, and is input to the waveform shaping circuit 21 of the output circuit 20. Therefore, the duty ratio of the clock signal CK1 output from the waveform shaping circuit 21 varies in accordance with the bias voltage Vrefb, and as a result, the duty ratio of the clock signal CKO output from the output circuit 20 also varies. Since the bias voltage Vrefb becomes a voltage corresponding to the duty ratio adjustment data supplied from the logic circuit 36, by setting appropriate duty ratio adjustment data to the nonvolatile memory 52, it is possible to approximate the duty ratio of the clock signal CKO to 50%.

The capacitance circuit 13 includes k capacitance elements 131-1 through 131-k, and k switch elements 132-1 through 132-k. The character k denotes an integer no smaller than 2. With respect to an integer i no smaller than 1 and no greater than k, one end of the capacitance element 131-i is electrically coupled to the XI terminal, and the other end of the capacitance element 131-i is electrically coupled to one end of the switch element 132-i. The other end of the switch element 132-i is electrically coupled to the ground.

The capacitance circuit 14 includes k capacitance elements 141-1 through 141-k, and k switch elements 142-1 through 142-k. With respect to the integer i no smaller than 1 and no greater than k, one end of the capacitance element 141-i is electrically coupled to the XO terminal, and the other end of the capacitance element 141-i is electrically coupled to one end of the switch element 142-i. The other end of the switch element 142-i is electrically coupled to the ground.

The switch elements 132-1 through 132-k are respectively set to the ON state or the OFF state in accordance with the values of the respective bits of the frequency adjustment data. The capacitance element 131-i is coupled between the XI terminal and the ground when the switch element 132-i is in the ON state. Similarly, the switch elements 142-1 through 142-k are respectively set to the ON state or the OFF state in accordance with the values of the respective bits of the frequency adjustment data. The capacitance element 141-i is coupled between the XO terminal and the ground when the switch element 142-i is in the ON state. The frequency adjustment data is stored in the nonvolatile memory 52, and the logic circuit 36 supplies the frequency adjustment data which has been transferred from the nonvolatile memory 52 to the register 51 to the capacitance circuits 13, 14.

The capacitance value of the capacitance circuit is a total sum of the capacitance values of the capacitance elements coupled between the XI terminal and the ground out of the capacitance elements 131-1 through 131-k. Further, the capacitance value of the capacitance circuit 14 is a total sum of the capacitance values of the capacitance elements coupled between the XO terminal and the ground out of the capacitance elements 141-1 through 141-k. Therefore, the capacitance values of the capacitance circuits 13, 14 vary in accordance with the frequency adjustment data. The capacitance circuits 13, 14 each function as a load capacitance of the resonator 3, and the frequency of the oscillation signal OSCO varies in accordance with the capacitance values of the capacitance circuits 13, 14. As a result, the frequency of the clock signal CKO varies. Therefore, by setting appropriate frequency adjustment data to the nonvolatile memory 52, it is possible to minimize the difference between the frequency of the clock signal CKO at the reference temperature and a target frequency. The reference temperature can be, for example, 25° C.

The variable capacitance circuit 15 includes a capacitance element 151, n variable capacitance elements 152-1 through 152-n, n capacitance elements 153-1 through 153-n, and a resistor element 154. In the capacitance element 151, one end is electrically coupled to the XI terminal, and the other end is electrically coupled to one ends of the variable capacitance elements 152-1 through 152-n, and one end of the resistor element 154. With respect to the integer i no smaller than 1 and no greater than n, the other end of the variable capacitance element 152-i is electrically coupled to one end of the capacitance element 153-i, and the other end of the capacitance element 153-i is electrically coupled to the ground. Further, the other end of the variable capacitance element 152-i and one end of the capacitance element 153-i are supplied with the reference voltage VcgC[i]. Further, one ends of the variable capacitance elements 152-1 through 152-n are supplied with the temperature compensation voltage Vcomp via the resistor element 154.

The variable capacitance circuit 16 includes a capacitance element 161, n variable capacitance elements 162-1 through 162-n, n capacitance elements 163-1 through 163-n, and a resistor element 164. In the capacitance element 161, one end is electrically coupled to the XO terminal, and the other end is electrically coupled to one ends of the variable capacitance elements 162-1 through 162-n, and one end of the resistor element 164. With respect to the integer i no smaller than 1 and no greater than n, the other end of the variable capacitance element 162-i is electrically coupled to one end of the capacitance element 163-i, and the other end of the capacitance element 163-i is electrically coupled to the ground. Further, the other end of the variable capacitance element 162-i and one end of the capacitance element 163-i are supplied with the reference voltage VcgC[i]. Further, one ends of the variable capacitance elements 162-1 through 162-n are supplied with the temperature compensation voltage Vcomp via the resistor element 164.

The capacitance values of the variable capacitance elements 152-1 through 152-n vary in accordance with the temperature compensation voltage Vcomp. Similarly, the capacitance values of the variable capacitance elements 162-1 through 162-n vary in accordance with the temperature compensation voltage Vcomp. Therefore, the capacitance values of the variable capacitance circuits 15, 16 vary in accordance with the temperature compensation voltage Vcomp. The variable capacitance circuits 15, 16 each function as a load capacitance of the resonator 3, and the frequency of the oscillation signal OSCO varies in accordance with the capacitance values of the variable capacitance circuits 15, 16. As a result, the frequency of the clock signal CKO varies. Therefore, by setting appropriate temperature compensation data to the nonvolatile memory 52, it is possible to minimize the difference between the frequency of the clock signal CKO at an arbitrary temperature in a predetermined temperature range and the target frequency.

The variable capacitance circuit 17 includes a capacitance element 171, m variable capacitance elements 172-1 through **172-*m*, m capacitance elements 173-1 through 173-*m*, and a resistor element 174. In the capacitance element 171, one end is electrically coupled to the XI terminal, and the other end is electrically coupled to one ends of the variable capacitance elements 172-1 through 172-*m*, and one end of the resistor element 174. With respect to the integer i no smaller than 1 and no greater than m, the other end of the variable capacitance element 172-*i* is electrically coupled to one end of the capacitance element 173-*i*, and the other end of the capacitance element 173-*i* is electrically coupled to the ground. Further, the other end of the variable capacitance element 172-*i* and one end of the capacitance element 173-*i* are supplied with the reference voltage VcgA[i]. Further, one ends of the variable capacitance elements 172-1 through 172-*m* are supplied with the frequency control voltage Vafc via the resistor element 174**.

The variable capacitance circuit 18 includes a capacitance element 181, m variable capacitance elements 182-1 through **182-*m*, m capacitance elements 183-1 through 183-*m*, and a resistor element 184. In the capacitance element 181, one end is electrically coupled to the XO terminal, and the other end is electrically coupled to one ends of the variable capacitance elements 182-1 through 182-*m*, and one end of the resistor element 184. With respect to the integer i no smaller than 1 and no greater than m, the other end of the variable capacitance element 182-*i* is electrically coupled to one end of the capacitance element 183-*i*, and the other end of the capacitance element 183-*i* is electrically coupled to the ground. Further, the other end of the variable capacitance element 182-*i* and one end of the capacitance element 183-*i* are supplied with the reference voltage VcgA[i]. Further, one ends of the variable capacitance elements 182-1 through 182-*m* are supplied with the frequency control voltage Vafc via the resistor element 184**.

The capacitance values of the variable capacitance elements 172-1 through **172-*m* vary in accordance with the frequency control voltage Vafc. Similarly, the capacitance values of the variable capacitance elements 182-1 through 182-*m* vary in accordance with the frequency control voltage Vafc. Therefore, the capacitance values of the variable capacitance circuits 17, 18 vary in accordance with the frequency control voltage Vafc. The variable capacitance circuits 17, 18 each function as a load capacitance of the resonator 3, and the frequency of the oscillation signal OSCO varies in accordance with the capacitance values of the variable capacitance circuits 17, 18**. As a result, the frequency of the clock signal CKO varies. Therefore, it is possible to vary the frequency of the clock signal CKO in accordance with the voltage to be applied to the T4 terminal.

For example, the capacitance elements 102, 103, 131-1 through **131-*k*, 141-1 through 141-*k*, 151, 153-1 through 153-*n*, 161, 163-1 through 163-*n*, 171, 173-1 through 173-*m*, 181, 183-1 through 183-*m* can each be an MIM (Metal Insulator Metal) type capacitor using metal as two electrodes, or can each be a PIP (Poly Insulator Poly) type capacitor using polysilicon as two electrodes. Further, for example, the variable capacitance elements 152-1 through 152-*n*, 162-1 through 162-*n*, 172-1 through 172-*m*, 182-1 through 182-*m*** can each be a varactor obtained by coupling the source and the drain of a MOS transistor to each other.

1-3. Examination of Oscillator

Figure 5:
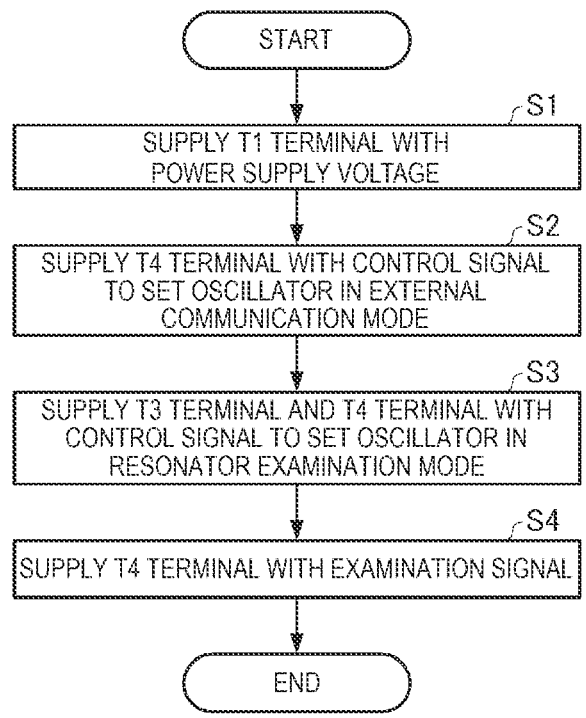
FIG. 5 is a flowchart showing an example of a procedure for examining the oscillator.
Figure 6:
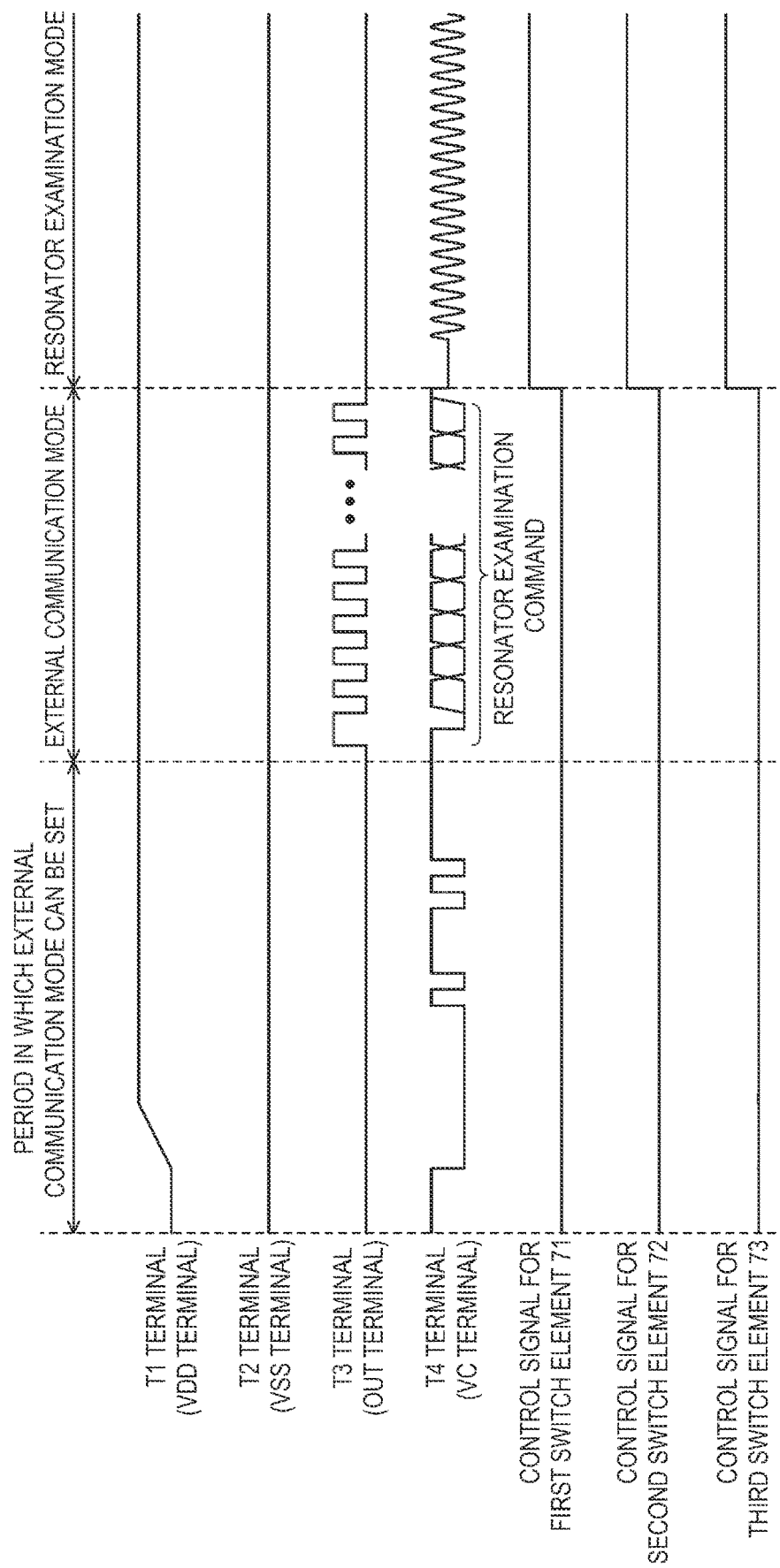
FIG. 6 is a diagram showing an example of signal waveforms of respective external terminals of the oscillator when examining the oscillator.

FIG. 5 is a flowchart showing an example of a procedure for supplying the oscillator 1 with an examination signal for performing the overdrive examination. Further, FIG. 6 is a diagram showing an example of signal waveforms of the T1 terminal, the T2 terminal, the T3 terminal, and the T4 terminal before supplying the examination signal to the oscillator 1 due to the flow chart shown in FIG. 5.

In the example shown in FIG. 5, first, the examination device supplies (step S1) the T1 terminal of the oscillator 1 with the power supply voltage. As shown in FIG. 6, due to the step S1, the T1 terminal rises in voltage from the ground voltage to a desired voltage.

Then, the examination device supplies the T4 terminal of the oscillator 1 with the control signal to set (step S2) the oscillator 1 to the external communication mode. In other words, as shown in FIG. 6, the examination device supplies the T4 terminal of the oscillator 1 with a signal having a predetermined pattern determined in advance to set the oscillator 1 to the external communication mode in a predetermined period from when the power supply voltage is supplied to the T1 terminal.

Then, the examination device supplies the T3 terminal and the T4 terminal of the oscillator 1 with the control signal to set (step S3) the oscillator 1 to the resonator examination mode. In other words, as shown in FIG. 6, in the external communication mode, the examination device supplies the T3 terminal with the serial clock signal, and supplies the T4 terminal with the resonator examination command as the serial data signal to set the oscillator 1 to the resonator examination mode. As shown in FIG. 6, due to the step S3, by the oscillator 1 changing from the external communication mode to the resonator examination mode, the control signals for the first switch element 71, the second switch element 72, and the third switch element 73 change from the low level to the high level. Thus, the first switch element 71, the second switch element 72, and the third switch element 73 are all set to the ON state, and thus, the XI terminal is electrically coupled to the ground, and the XO terminal is coupled to the T4 terminal.

Then, the examination device supplies the T4 terminal with the examination signal for performing the overdrive examination. As shown in FIG. 6, the examination signal is a signal with the maximum amplitude periodically vibrating between the power supply voltage supplied to the T1 terminal and the ground voltage supplied to the T2 terminal. The frequency of the examination signal is substantially equal to the resonance frequency of the resonator 3, and the resonator 3 resonates in response to the supply of the examination signal.

Therefore, for example, by the examination device supplying the oscillator 1 with the examination signal in the resonator examination mode before performing the characteristic examination of the oscillator 1, foreign matters such as metallic pieces remaining on the resonator 3 when forming the excitation electrodes **3*a*, 3*b* are shaken off therefrom. Further, for example, in the characteristic examination of the oscillator 1, the examination device adjusts the frequency of the clock signal CKO into the target frequency, then makes the transition of the oscillator 1 to the resonator examination mode, and then supplies the T3 terminal with the examination signal. Subsequently, the examination device makes the transition of the oscillator 1** to the normal operation mode, and then measures the frequency of the clock signal CKO output from the T3 terminal. For example, when the foreign matters such as the metallic pieces remaining on the resonator 3 are not sufficiently shaken off before performing the characteristic examination of the oscillator 1, and then some of the remaining foreign matters are shaken off due to this examination signal, the characteristics of the oscillator 1 change to cause a significant difference between the frequency of the clock signal CKO and the target frequency. Therefore, when the difference between the frequency measured and the target frequency exceeds a predetermined threshold, it is possible for the examination device to determine that the characteristics of the oscillator 1 have changed around the overdrive, and judge the oscillator 1 as defective.

It should be noted that although in FIG. 5 and FIG. 6, the examination device supplies the T4 terminal with the examination signal for performing the overdrive examination in the resonator examination mode, it is possible for the examination device to supply the examination signal for performing the drive level examination. For example, the examination signal is a signal with the amplitude varying at regular time intervals, and the examination device measures the frequency of the clock signal CKO output from the T3 terminal every time the amplitude of the examination signal varies. Further, when the frequency of the clock signal CKO exceeds a predetermined range in a range in which the amplitude of the examination signal is changed, in other words, when the frequency of the clock signal CKO changes dramatically in a predetermined excitation level, it is possible for the examination device to determine that a structural defect exists in the resonator 3 to judge the oscillator 1 as defective.

1-4. Functions and Advantages

Assuming that the first switch element 71 is set to the OFF state in the resonator examination mode, or the first switch element 71 does not exist, the examination signal to be supplied to the XO terminal from the T4 terminal via the third switch element 73 is input to the base of the bipolar transistor 101 via the first resistor element 81 as the feedback resistor. As a result, the condition for the bipolar transistor 101 to operate is fulfilled, and there is a possibility that the bipolar transistor 101 generates a signal for hindering the examination signal, and thus, the examination device cannot apply the examination signal high in amplitude to the T4 terminal. In contrast, in the oscillator 1 according to the present embodiment, since it is possible for the first switch element 71 to be set to the ON state to thereby set the bipolar transistor 101 to the OFF state in the resonator examination mode, it is possible to reduce the possibility that the bipolar transistor 101 affects the examination signal.

It should be noted that in the resonator examination mode, when the bipolar transistor 101 is in the OFF state, substantially the same advantage as described above can be obtained, and therefore, it is desirable for the potential difference Vbe between the base of the bipolar transistor 101 and the ground to be smaller than the diffusion potential of the P-N junction of silicon when the first switching element 71 is in the OFF state. Specifically, in the environment in which the ambient temperature of the oscillator 1 is 25° C., it is desirable for the potential difference Vbe to be no less than 0 V and less than 0.6 V. Thus, it is possible to more surely set the bipolar transistor 101 to the OFF state.

Further, when the first switch element 71 is in the ON state, the second switch element 72 and the third switch element 73 are also set to the ON state. In other words, in the resonator examination mode, the first switch element 71, the second switch element 72, and the third switch element 73 are set to the ON state, the bipolar transistor 101 is set to the OFF state, the T2 terminal and the XI terminal are electrically coupled to each other, and the T4 terminal and the XO terminal are electrically coupled to each other. As a result, the overdrive examination and the drive level examination become possible. Further, when the first switch element 71 is in the OFF state, the second switch element 72 and the third switch element 73 are also set to the OFF state. In other words, in the normal operation mode, the first switch element 71, the second switch element 72, and the third switch element 73 are set to the OFF state, the bipolar transistor 101 is set to the ON state, the T2 terminal and the XI terminal are electrically separated from each other, and the T4 terminal and the XO terminal are electrically separated from each other. As a result, even when a constant control voltage is input to the T4 terminal, it is possible for the bipolar transistor 101 to oscillate the resonator 3. As described above, in the oscillator 1 according to the present embodiment, the T2 terminal and the T4 terminal which are the external terminals of the oscillator 1, and are used in the normal operation mode can also be used in the overdrive examination and the drive level examination. Therefore, it is possible to simplify the configuration of the circuit device 2.

2. Second Embodiment

The oscillation circuit 10 in a second embodiment will be described. In explaining the oscillation circuit in the second embodiment, substantially the same constituents as those of the oscillation circuit 10 in the first embodiment will be denoted by the same reference numerals, and the description thereof will be omitted or simplified.

Figure 7:
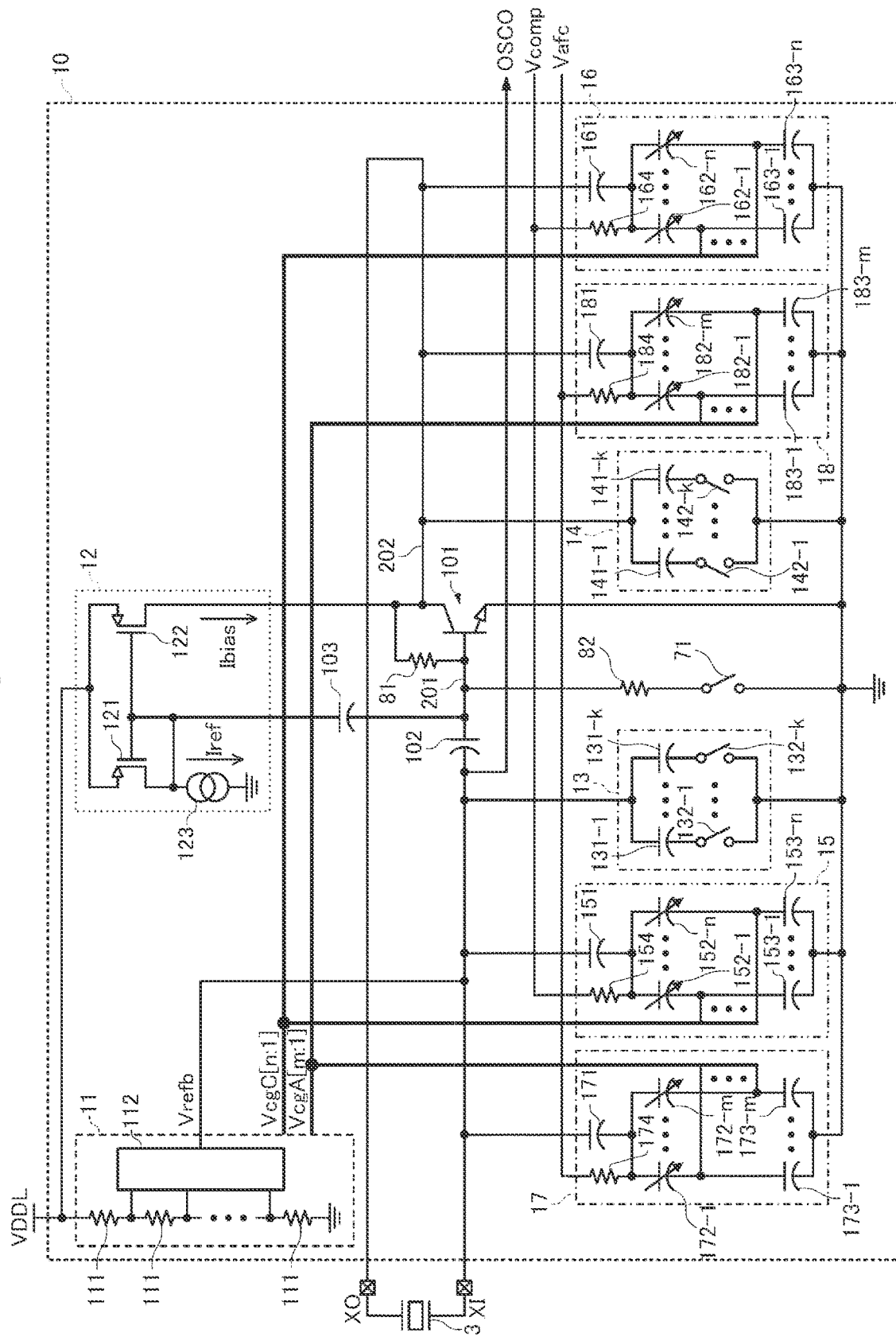
FIG. 7 is a diagram showing a schematic configuration of a circuit device according to a second embodiment.

FIG. 7 is a diagram showing a configuration example of the oscillation circuit 10 in the second embodiment. As shown in FIG. 7, the oscillation circuit 10 includes a second resistor element 82. It should be noted that the oscillation circuit 10 in the second embodiment can be provided with a configuration obtained by eliminating or modifying some of these constituents, or adding other constituents.

One end of the second resistor element 82 is electrically coupled to the base of the bipolar transistor 101, and the other end of the second resistor element 82 is electrically coupled to the one end of the first switch element 71. The one end of the first switch element 71 is electrically coupled to the second resistor element 82, and the other end of the first switch element 71 is electrically coupled to the ground. In other words, the second resistor element 82 is disposed on the signal path between the input node 201 of the amplifying element and the ground.

In the resonator examination mode in the second embodiment, the first switch element 71 is set to the ON state, the second resistor element 82 is electrically coupled to the ground, and the potential of the input node 201 is set to the ground. Since the ON resistance of the first switch element 71 is extremely low, the potential difference Vbe between the base and the emitter of the bipolar transistor 101 approximates to 0 V. Therefore, the bipolar transistor 101 is set to the OFF state. Ideally, the ON resistance of the first switch element 71 is zero, and the potential difference Vbe becomes 0 V. Therefore, substantially the same advantages as those of the first embodiment described above can be obtained.

For example, when using a transistor such as an FET as the first switch element 71, the impedance of the first node 201 drops in some cases due to a parasitic capacitance of the transistor. Therefore, there is a possibility that there occur a decrease in oscillation amplitude, and a variation in frequency of the oscillation signal OSCO output from the oscillation circuit 10. Further, there is a possibility that the parasitic capacitance becomes a path of a leakage current. In the resonator examination mode in the second embodiment, since the impedance of the input node 201 can be raised by the second resistor element 82, it is possible to reduce the possibility described above. Therefore, it is possible to perform the resonator examination in a more stable state.

3. Third Embodiment

The oscillation circuit 10 in a third embodiment will be described. In explaining the oscillation circuit in the third embodiment, substantially the same constituents as those of the oscillation circuit 10 in the first embodiment will be denoted by the same reference numerals, and the description thereof will be omitted or simplified.

Figure 8:
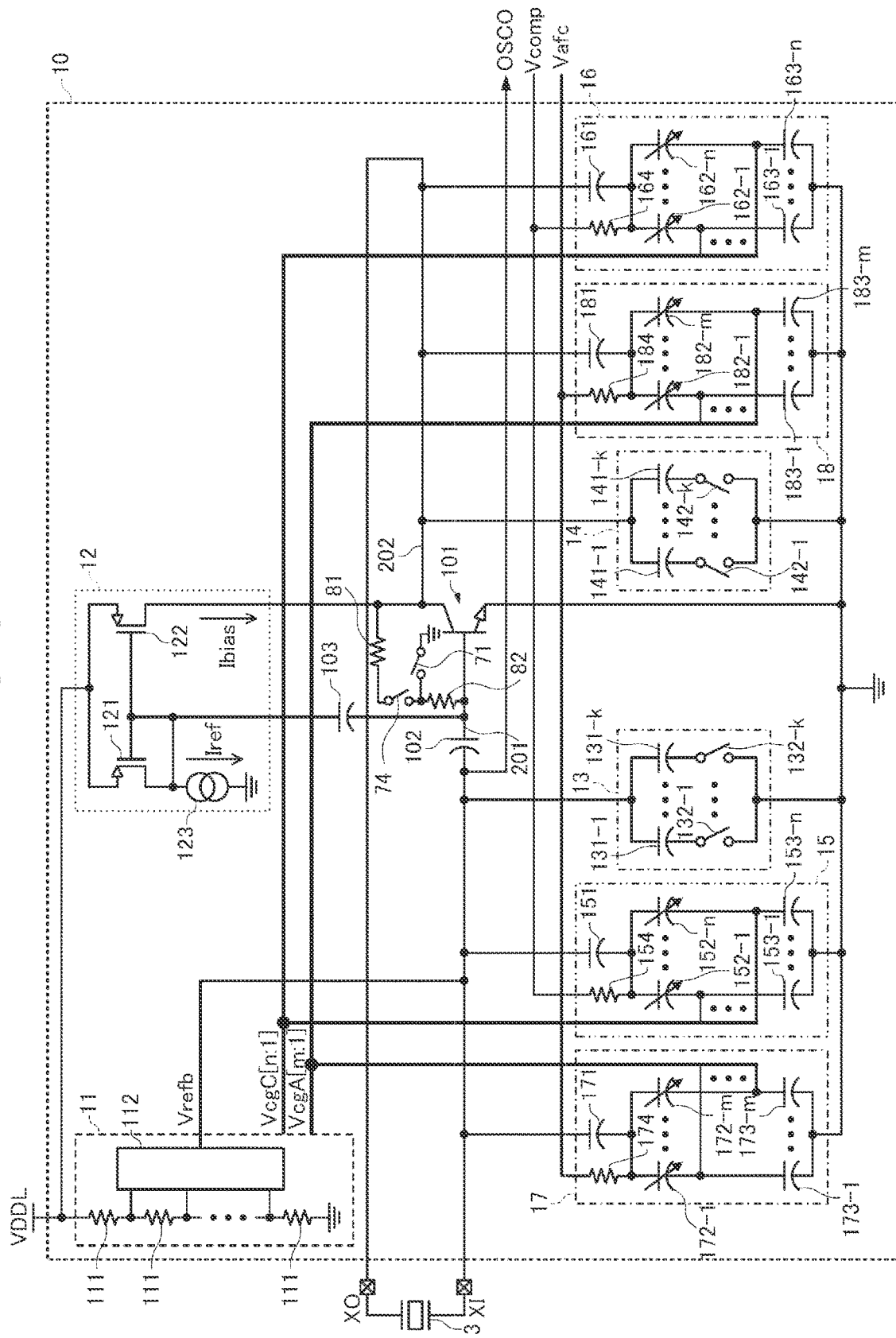
FIG. 8 is a diagram showing a schematic configuration of a circuit device according to a third embodiment.

FIG. 8 is a diagram showing a configuration example of the oscillation circuit 10 in the third embodiment. As shown in FIG. 8, the oscillation circuit 10 includes the second resistor element 82, and a fourth switch element 74. It should be noted that the oscillation circuit in the third embodiment can be provided with a configuration obtained by eliminating or modifying some of these constituents, or adding other constituents.

One end of the second resistor element 82 is electrically coupled to the base of the bipolar transistor 101, and the other end of the second resistor element 82 is electrically coupled to the first switch element 71 and the fourth switch element 74. The first resistor element 81 and the second resistor element 82 function as the feedback resistor for the bipolar transistor 101.

The fourth switch element 74 is set to the ON state or the OFF state in accordance with the switch control data. The switch control data is supplied to the fourth switch element 74 from the logic circuit 36. In other words, the fourth switch element 74 switches the electrical coupling between the first resistor element 81 and the second resistor element 82.

One end of the fourth switch element 74 is electrically coupled to the first resistor element 81, and the other end of the fourth switch element 74 is electrically coupled to the first switch element 71 and the second resistor element 82. When the fourth switch element 74 is in the ON state, the first resistor element 81 and the second resistor element 82 are set to the conducting state, and when the fourth switch element 74 is in the OFF state, the first resistor element 81 and the second resistor element 82 are set to the nonconducting state.

In the normal operation mode, the fourth switch element 74 is set to the ON state, and in the resonator examination mode, the fourth switch element 74 is set to the OFF state. In the normal operation mode, the first resistor element 81 and the second resistor element 82 function as the feedback resistor for the bipolar transistor 101, and in the resonator examination mode, the first resistor element 81 and the second resistor element 82 are electrically separated from each other, but do not function as the feedback resistor for the bipolar transistor 101.

In the resonator examination mode in the third embodiment, the first switch element 71 is set to the ON state, the second resistor element 82 is electrically coupled to the ground, and the potential of the input node 201 is set to the ground. Therefore, the potential difference Vbe becomes 0 V, and it is possible to set the bipolar transistor 101 to the OFF state. Therefore, substantially the same advantages as those of the first embodiment described above can be obtained.

In the resonator examination mode in the third embodiment, since the feedback resistor for the bipolar transistor 101 is electrically cut, it is possible to more surely set the bipolar transistor 101 to the OFF state.

4. Fourth Embodiment

The oscillation circuit 10 in a fourth embodiment will be described. In explaining the oscillation circuit in the fourth embodiment, substantially the same constituents as those of the oscillation circuit 10 in the first embodiment will be denoted by the same reference numerals, and the description thereof will be omitted or simplified.

Figure 9:
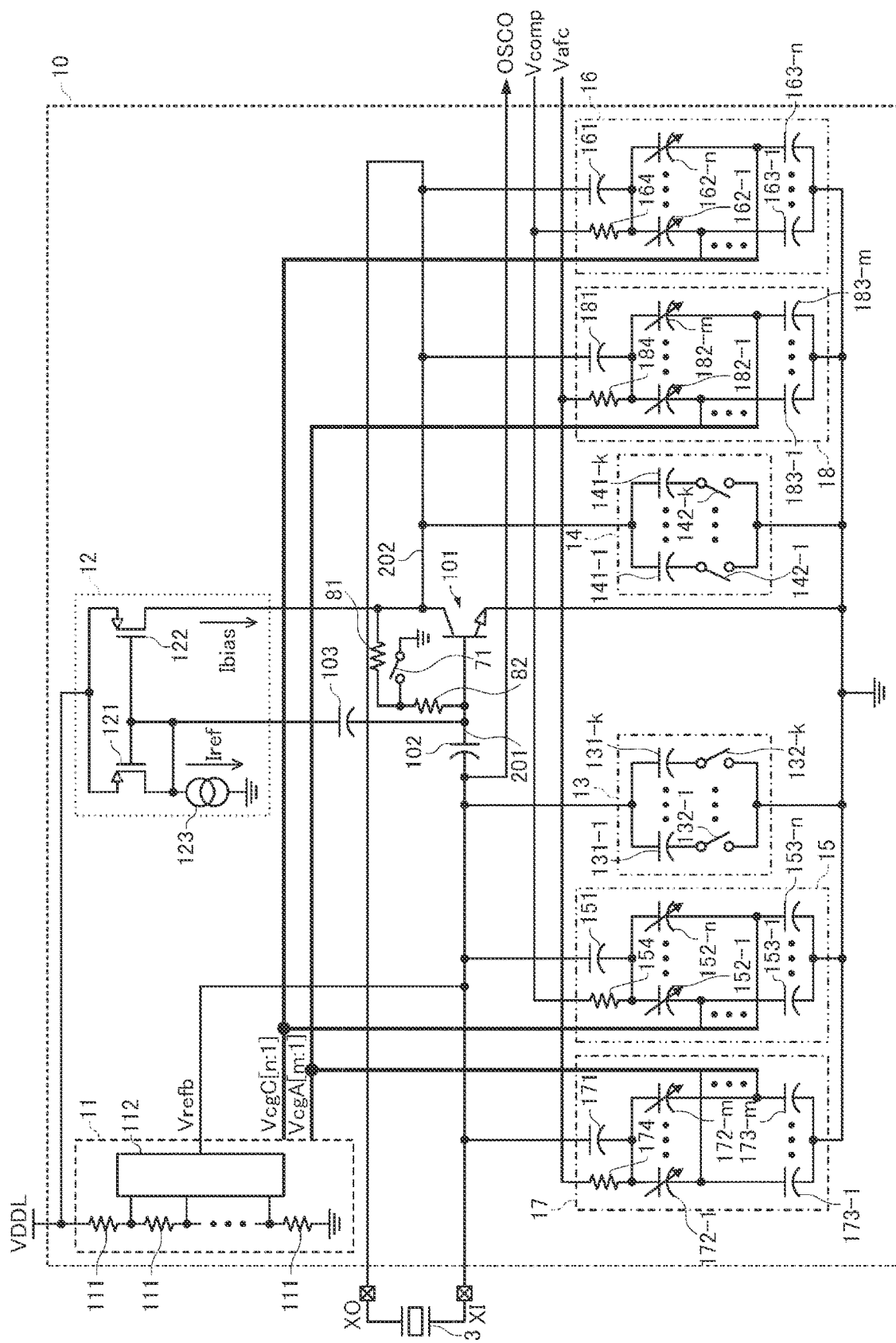
FIG. 9 is a diagram showing a schematic configuration of a circuit device according to a fourth embodiment.

FIG. 9 is a diagram showing a configuration example of the oscillation circuit 10 in the fourth embodiment. As shown in FIG. 9, the oscillation circuit 10 includes the second resistor element 82. It should be noted that the oscillation circuit 10 in the fourth embodiment can be provided with a configuration obtained by eliminating or modifying some of these constituents, or adding other constituents.

One end of the first resistor element 81 is electrically coupled to the output node 202, and the other end of the first resistor element 81 is electrically coupled to the first switch element 71 and the second resistor element 82. The first resistor element 81 and the second resistor element 82 form the feedback resistor for the bipolar transistor 101.

In the resonator examination mode in the fourth embodiment, the first switch element 71 is set to the ON state, the second resistor element 82 is electrically coupled to the ground, and the potential of the input node 201 is set to the ground. Since the ON resistance of the first switch element 71 is extremely low, the potential difference Vbe between the base and the emitter of the bipolar transistor 101 approximates to 0 V. Therefore, the bipolar transistor 101 is set to the OFF state. Ideally, the ON resistance of the first switch element 71 is zero, and the potential difference Vbe becomes 0 V. Therefore, substantially the same advantages as those of the first embodiment described above can be obtained. Further, unlike the third embodiment, since the fourth switch element 74 for electrically coupling the first resistor element 81 and the second resistor element 82 to each other is omitted, it is possible to simplify the configuration of the circuit device 2.

5. Modified Example 1

Figure 10:
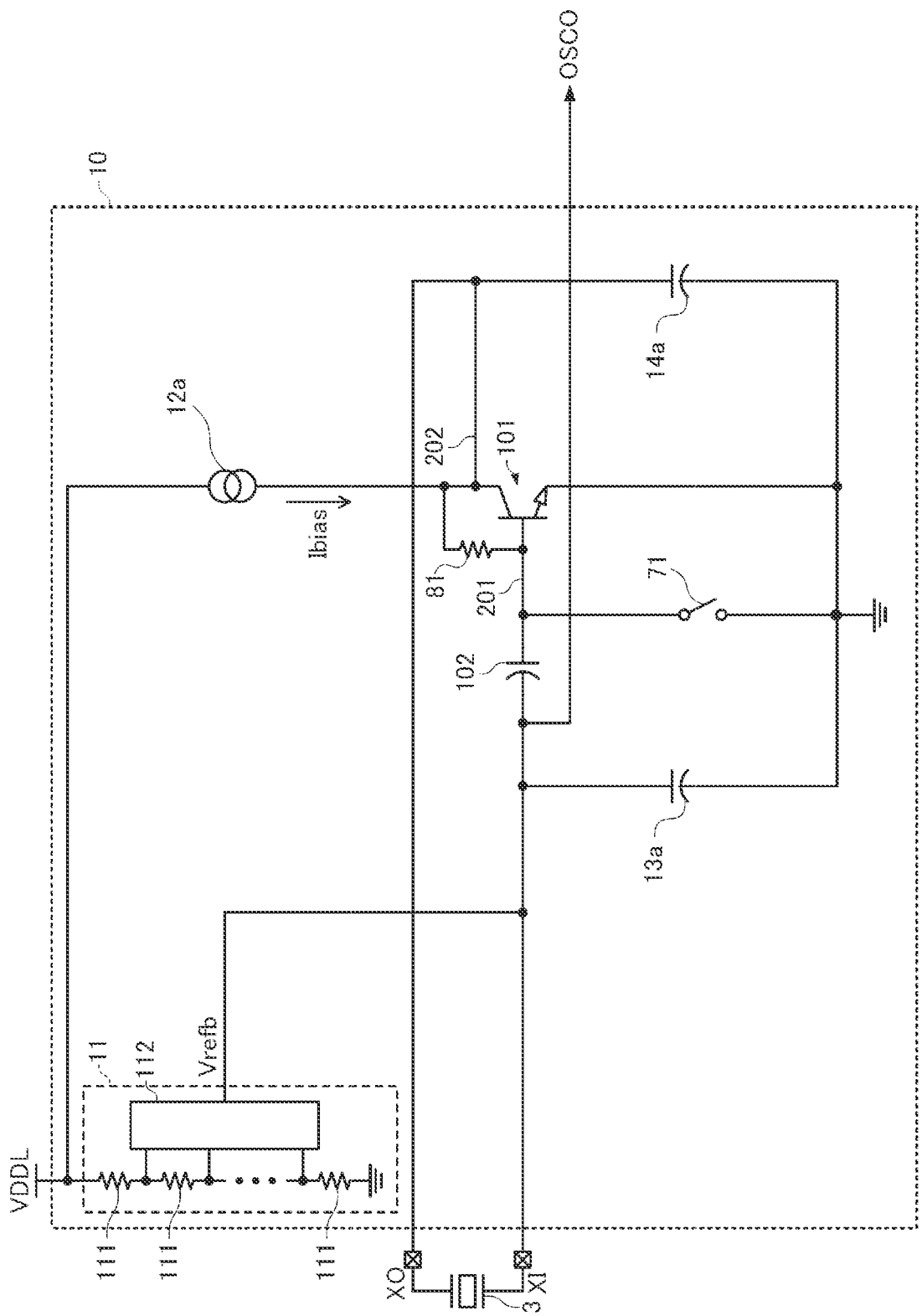
FIG. 10 is a diagram showing a schematic configuration of an oscillator according to Modified Example 1.

FIG. 10 is a diagram showing a schematic configuration of the oscillation circuit 10 in Modified Example 1. In the circuit device 2 according to Modified Example 1, there are omitted the temperature sensor 30, the temperature compensation circuit 32, and the frequency control circuit 34. Due to this omission, in the oscillation circuit 10 in Modified Example shown in FIG. 10, the capacitance circuits 13, 14 are replaced with capacitance elements 13a, 14a, the bias current generation circuit 12 is replaced with a constant current source 12a, and the variable capacitance circuits 17, 18 are omitted.

In the resonator examination mode in Modified Example 1, the first switch element 71 is set to the ON state, and the potential of the input node 201 is set to the ground. Therefore, the potential difference Vbe approximates to 0 V, and it is possible to set the bipolar transistor 101 to the OFF state.

Therefore, substantially the same advantages as those of the first embodiment described above can be obtained.

6. Modified Example 2

Figure 11:
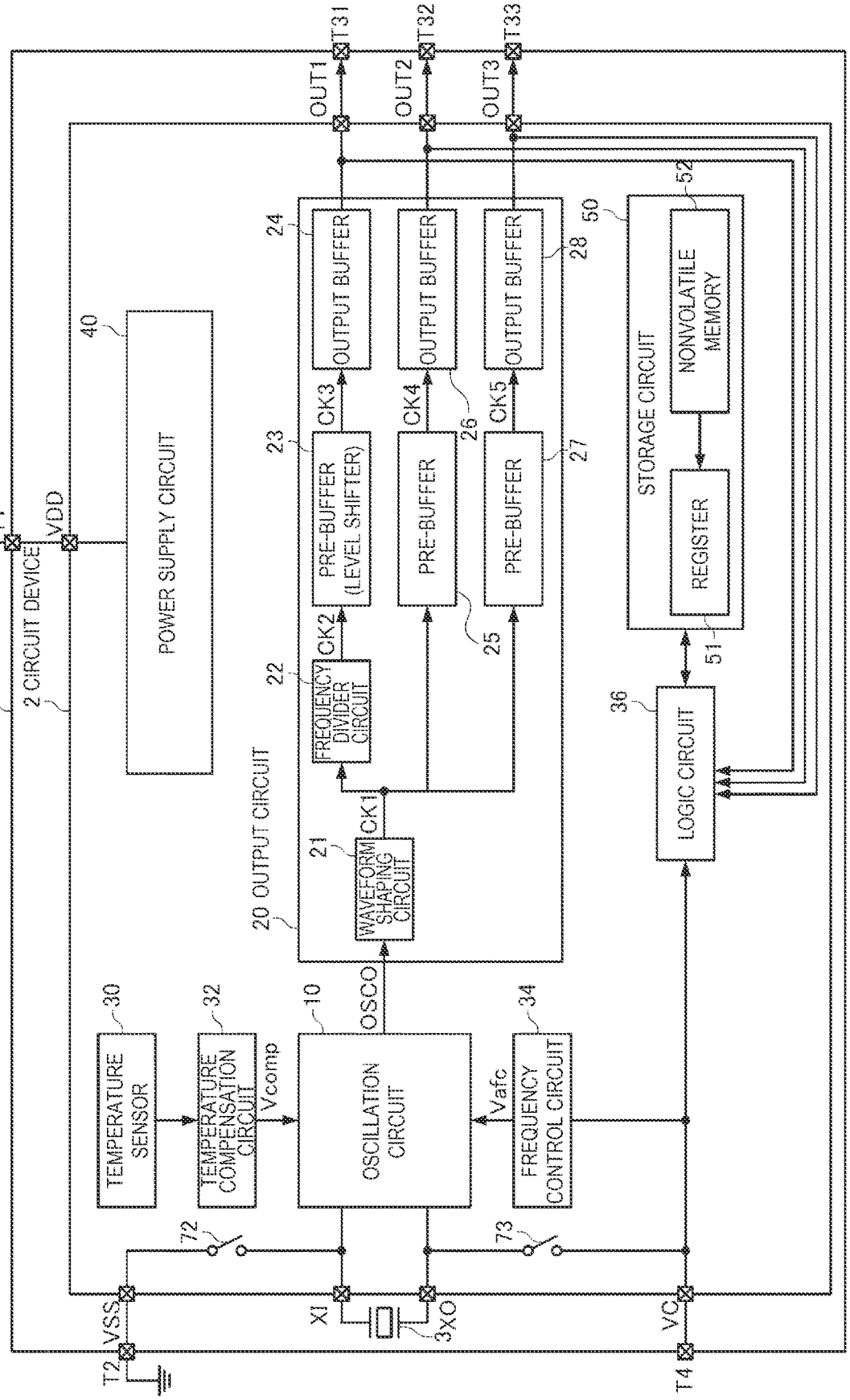
FIG. 11 is a diagram showing a schematic configuration of a circuit device according to Modified Example 2.

FIG. 11 is a diagram showing a schematic configuration of the oscillator 1 in Modified Example 2. The oscillator 1 shown in FIG. 11 outputs a plurality of output signals. Specifically, the output circuit 20 of the circuit device 2 outputs clock signals CKO1, CKO2, and CKO3. These clock signals CKO1, CKO2, and CKO3 are respectively output from the oscillator 1 via a T31 terminal, a T32 terminal, and a T33 terminal. In the oscillator 1 for outputting such a plurality of signals, it is possible to apply the oscillation circuit 10 in the embodiments described above. Therefore, also in the oscillator 1 in Modified Example 2, it is possible to switch between the normal operation mode and the resonator examination mode, and in the resonator examination mode, the first switch element 71 is set to the ON state, and the potential of the input node 201 is set to the ground. Therefore, the potential difference Vbe approximates to 0 V, and it is possible to set the bipolar transistor 101 to the OFF state. Therefore, substantially the same advantages as those of the first embodiment described above can be obtained. It should be noted that the oscillation circuit 10 to be applied to Modified Example 2 can be provided with the second resistor element 82 as in the second embodiment. The advantages of the second embodiment can further be obtained.

7. Functions and Advantages

As described hereinabove, the circuit device 2 in the present embodiments is capable of setting the amplifying element to the OFF state in the resonator examination mode. Therefore, it is possible to perform the stable examination without being affected by the amplifying element.

Although the embodiments and the modified examples are hereinabove described, the present disclosure is not limited to the embodiments and the modified examples described above, but can be put into practice in a variety of aspects within the scope or the spirit of the present disclosure. For example, it is also possible to arbitrarily combine the embodiments described above.

The present disclosure includes configurations (e.g., configurations having the same function, the same way, and the same result, or configurations having the same object and the same advantages) substantially the same as the configurations described as the embodiments. Further, the present disclosure includes configurations obtained by replacing a non-essential part of the configurations described as the embodiments. Further, the present disclosure includes configurations providing the same functions and the same advantages, or configurations capable of achieving the same object as those of the configurations described as the embodiments. Further, the present disclosure includes configurations obtained by adding a known technology to the configurations described as the embodiments.

The following contents derive from the embodiments and the modified examples described above.

A circuit device according to an aspect of the present disclosure includes a first terminal to be coupled to one end of a resonator, a second terminal to be coupled to another end of the resonator, an amplifying element configured to amplify a signal from the first terminal to output the signal amplified to the second terminal, a first resistor element disposed on a signal path between an input node and an output node of the amplifying element, a capacitance element disposed on a signal path between the first terminal and the input node, and a first switch element configured to switch electrical coupling between the input node and a ground.

According to this circuit device, since the input node of the amplifier and the ground are electrically coupled to each other by the first switch element to thereby make it possible to stop the amplifier, it is possible to input the signal between the first terminal and the second terminal without being affected by the amplifier to thereby perform the examination of the resonator. For example, it is possible to input the signal high in amplitude between the first terminal and the second terminal to perform the examination of the resonator.

In the circuit device according to the aspect, there may further be included a third terminal, a fourth terminal, a second switch element configured to switch electrical coupling between the first terminal and the third terminal, and a third switch element configured to switch electrical coupling between the second terminal and the fourth terminal, wherein in a first mode, the first switch element, the second switch element, and the third switch element may be set to an OFF state, and in a second mode, the first switch element, the second switch element, and the third switch element may be set to an ON state.

According to this circuit device, it is possible to make the circuit device operate in the first mode and the second mode by switching between the ON state and the OFF state of the first switch element, the second switch element, and the third switch element. In the first mode, since the first switch element is in the OFF state, the input node of the amplifier and the ground are not electrically coupled to each other, and the amplifier performs a normal operation. Therefore, it is possible to input signals respectively to the first terminal, the second terminal, the third terminal, and the fourth terminal to make the circuit device perform the normal operation. Further, since the terminals are commonly used in both of the first mode and the second mode, it is possible to simplify the configuration of the circuit device. In the second mode, since the first switch element is in the ON state, the input node of the amplifier and the ground are electrically coupled to each other, and the amplifier stops. Therefore, it is possible to supply a signal for examining the resonator between the third terminal to electrically be coupled to the first terminal, and the fourth terminal to electrically be coupled to the second terminal to thereby examine the resonator.

In the circuit device according to the aspect, there may further be included a second resistor element disposed on a signal path between the input node and the ground, wherein one end of the first switch element may electrically be coupled to the second resistor element, and another end of the first switch element may electrically be coupled to the ground.

According to this circuit device, it is possible to raise the impedance of the input node using the second resistor element. In other words, it is possible for the second resistor element to suppress the influence of the fluctuation of the impedance of the input node caused by the first switch element. Thus, the operation of the circuit device stabilizes.

In the circuit device according to the aspect, there may further be included a fourth switch element configured to switch electrical coupling between the first resistor element and the second resistor element, wherein one end of the fourth switch element may electrically be coupled to the first resistor element, and another end of the fourth switch element may electrically be coupled to the first switch element and the second resistor element.

According to this circuit device, when the fourth switch element is in the OFF state, the first resistor element and the second resistor element for electrically coupling the output node and the input node of the amplifier element are electrically separated from each other. Therefore, it is possible to electrically separate the input node and the output node of the amplifying element from each other. Thus, it is possible to more surely set the amplifying element to the OFF state.

In the circuit device according to the aspect, in the first mode, the fourth switch element may be set to the ON state, and in the second mode, the fourth switch element may be set to the OFF state.

According to this circuit device, in the second mode, the fourth switch is set to the OFF state, and thus, the first resistor element and the second resistor element are electrically separated from each other. In the second mode, since the feedback resistor for the amplifier is electrically cut, it is possible to more surely set the amplifying element to the OFF state. Further, the fourth switch element is set to the ON state, and in the first mode, the first resistor element and the second resistor element function as the feedback resistor, and therefore, in each of the first mode and the second mode, it is possible to make the circuit device operate in a further optimum state.

In the circuit device according to the aspect, one end of the first resistor element may electrically be coupled to the output node, and another end of the first resistor element may electrically be coupled to the first switch element and the second resistor element.

According to this circuit device, since there is omitted the switch element for electrically coupling the first resistor element and the second register element to each other, it is possible to simplify the configuration of the circuit device. Further, since it is possible to switch between the first mode and the second mode with the first switch element, it is possible to simplify the configuration of the circuit device while keeping the function.

In the circuit device according to the aspect, the amplifying element may be a bipolar transistor, the input node may be a base of the bipolar transistor, and the output node may be a collector of the bipolar transistor.

According to this circuit device, since a current a predetermined number of times as high as the current flowing through the base flows through the collector in the bipolar transistor, the bipolar transistor can easily be controlled. Further, by constituting the amplifying element with the bipolar transistor, it is possible to simplify the configuration of the circuit device.

In the circuit device according to the aspect, when the first switch element is in the ON state, a potential difference between the base and the ground may be smaller than a diffusion potential of a P-N junction.

According to this circuit device, in the first mode, since the amplifying element stops, the bipolar transistor is set to the OFF state. The base and the emitter of the bipolar transistor are constituted by the P-N junction, and in the first mode, by making the potential difference between the base and the ground smaller than the diffusion potential of the P-N junction, it is possible to set the bipolar transistor to the OFF state.

In the circuit device according to the aspect, in an environment in which an ambient temperature is 25° C., the potential difference may be no less than 0 V and less than 0.6 V.

According to this circuit device, by making the potential difference between the base of the bipolar transistor and the ground no less than 0 V and less than 0.6 V, it is possible to more surely set the bipolar transistor to the OFF state.

An oscillator according to an aspect of the present disclosure includes the circuit device according to the aspect, and the resonator.

According to this oscillator, since the input node of the amplifier and the ground are electrically coupled to each other by the first switch element to thereby make it possible to stop the amplifier, it is possible to input the signal between the first terminal and the second terminal without being affected by the amplifier to thereby perform the examination of the resonator. For example, it is possible to input the signal high in amplitude between the first terminal and the second terminal to perform the examination of the resonator.

What is claimed is:

1. A circuit device comprising:
a first terminal to be coupled to one end of a resonator;
a second terminal to be coupled to another end of the resonator;
an amplifying element configured to amplify a signal from the first terminal to output the signal amplified to the second terminal;
a first resistor element disposed on a signal path between an input node and an output node of the amplifying element;
a capacitance element disposed on a signal path between the first terminal and the input node;
a first switch element configured to switch electrical coupling between the input node and a ground;
a third terminal;
a fourth terminal;
a second switch element configured to switch electrical coupling between the first terminal and the third terminal; and
a third switch element configured to switch electrical coupling between the second terminal and the fourth terminal,
wherein
in a first mode, the first switch element, the second switch element, and the third switch element are set to an OFF state, and
in a second mode, the first switch element, the second switch element, and the third switch element are set to an ON state.

2. The circuit device according to claim 1, further comprising:
a second resistor element disposed on a signal path between the input node and the ground, wherein
one end of the first switch element is electrically coupled to the second resistor element, and
another end of the first switch element is electrically coupled to the ground.

3. The circuit device according to claim 2, further comprising:
a fourth switch element configured to switch electrical coupling between the first resistor element and the second resistor element, wherein
one end of the fourth switch element is electrically coupled to the first resistor element, and
another end of the fourth switch element is electrically coupled to the first switch element and the second resistor element.

4. The circuit device according to claim 3, wherein
in the first mode, the fourth switch element is set to the ON state, and in the second mode, the fourth switch element is set to the OFF state.

5. The circuit device according to claim 2, wherein
one end of the first resistor element is electrically coupled to the output node, and
another end of the first resistor element is electrically coupled to the first switch element and the second resistor element.

6. An oscillator comprising:
the circuit device according to claim 1; and
the resonator.

7. A circuit device comprising:
a first terminal to be coupled to one end of a resonator;
a second terminal to be coupled to another end of the resonator;
an amplifying element configured to amplify a signal from the first terminal to output the signal amplified to the second terminal;
a first resistor element disposed on a signal path between an input node and an output node of the amplifying element;
a capacitance element disposed on a signal path between the first terminal and the input node; and
a first switch element configured to switch electrical coupling between the input node and a ground, wherein
the amplifying element is a bipolar transistor,
the input node is a base of the bipolar transistor,
the output node is a collector of the bipolar transistor, and
when the first switch element is in an ON state, a potential difference between the base and the ground is smaller than a diffusion potential of a P-N junction.

8. The circuit device according to claim 7, wherein
in an environment in which an ambient temperature is 25° C., the potential difference is no less than 0 V and less than 0.6 V.

9. The circuit device according to claim 7, further comprising:
a third terminal;
a fourth terminal;
a second switch element configured to switch electrical coupling between the first terminal and the third terminal; and
a third switch element configured to switch electrical coupling between the second terminal and the fourth terminal, wherein
in a first mode, the first switch element, the second switch element, and the third switch element are set to an OFF state, and
in a second mode, the first switch element, the second switch element, and the third switch element are set to the ON state.

10. The circuit device according to claim 9, further comprising:
a second resistor element disposed on a signal path between the input node and the ground, wherein
one end of the first switch element is electrically coupled to the second resistor element, and
another end of the first switch element is electrically coupled to the ground.

11. The circuit device according to claim 10, further comprising:
a fourth switch element configured to switch electrical coupling between the first resistor element and the second resistor element, wherein
one end of the fourth switch element is electrically coupled to the first resistor element, and
another end of the fourth switch element is electrically coupled to the first switch element and the second resistor element.

12. The circuit device according to claim 11, wherein
in the first mode, the fourth switch element is set to the ON state, and
in the second mode, the fourth switch element is set to the OFF state.

13. The circuit device according to claim 10, wherein
one end of the first resistor element is electrically coupled to the output node, and
another end of the first resistor element is electrically coupled to the first switch element and the second resistor element.

14. An oscillator comprising:
the circuit device according to claim 7; and
the resonator.

* * * * *